United States Patent
McCoy et al.

(10) Patent No.: US 9,860,052 B2
(45) Date of Patent: Jan. 2, 2018

(54) DIGITAL PREDISTORTION FOR FULL-DUPLEX RADIO

(71) Applicant: NATIONAL INSTRUMENTS CORPORATION, Austin, TX (US)

(72) Inventors: James W. McCoy, Leander, TX (US); Takao Inoue, Austin, TX (US); Jaeweon Kim, Cedar Park, TX (US)

(73) Assignee: National Instruments Corporation, Austin, TX (US)

(*) Notice: Subject to any disclaimer, the term of this patent is extended or adjusted under 35 U.S.C. 154(b) by 53 days.

(21) Appl. No.: 14/878,645

(22) Filed: Oct. 8, 2015

(65) Prior Publication Data

US 2017/0033915 A1 Feb. 2, 2017

Related U.S. Application Data

(60) Provisional application No. 62/198,734, filed on Jul. 30, 2015.

(51) Int. Cl.
*H04L 1/00* (2006.01)
*H04L 5/14* (2006.01)
(Continued)

(52) U.S. Cl.
CPC .......... *H04L 5/14* (2013.01); *H04B 1/44* (2013.01); *H04L 25/08* (2013.01); *H04L 27/0002* (2013.01); *H04L 27/368* (2013.01)

(58) Field of Classification Search
CPC ....... H04L 5/14; H04L 27/0002; H04L 25/08; H04B 1/44
See application file for complete search history.

(56) References Cited

U.S. PATENT DOCUMENTS

| 6,614,854 B1* | 9/2003 | Chow | H04L 1/0016 330/302 |
| 2002/0080728 A1* | 6/2002 | Sugar | H04B 1/0003 370/252 |

(Continued)

OTHER PUBLICATIONS

Morgan, Dennis R. et al.—"A Generalized Memory Polynormial Model for Digital Predistortion of RF Power Amplifiers" IEEE Transactions on Signal Processing, vol. 54, No. 10, Oct. 2006, pp. 3852-3860 (9 pages).

(Continued)

*Primary Examiner* — Clemence Han
(74) *Attorney, Agent, or Firm* — Meyertons Hood Kivlin Kowert & Goetzel, P.C.; Jeffrey C. Hood; Michael B. Davis (57) ABSTRACT

Techniques are disclosed relating to use of digital predistortion in the context of full-duplex radio. In some embodiments, an apparatus includes one or more antennas and is configured to simultaneously transmit and receive wireless signals via at least partially overlapping frequency resources using the one or more antennas. In some embodiments, the apparatus includes receive chain circuitry that is configured to process both wireless signals transmitted by the apparatus via the one or more antennas and over-the-air wireless signals from one or more other computing devices. In some embodiments, the apparatus includes one or more processing elements configured to determine one or more digital predistortion parameters based on the wireless signals transmitted by the apparatus via the one or more antennas and processed by the receive chain circuitry and apply predistortion to transmitted wireless signals based on the one or more digital predistortion parameters.

20 Claims, 4 Drawing Sheets

(51) Int. Cl.
    *H04L 25/08*     (2006.01)
    *H04L 27/00*     (2006.01)
    *H04B 1/44*     (2006.01)
    *H04L 27/36*     (2006.01)

(56) References Cited

U.S. PATENT DOCUMENTS

| | | | | |
|---|---|---|---|---|
| 2014/0376423 | A1* | 12/2014 | Lu | H04L 25/0328 370/280 |
| 2015/0146765 | A1* | 5/2015 | Moffatt | H04B 1/62 375/219 |
| 2016/0211810 | A1* | 7/2016 | Kerek | H03F 1/0288 |

OTHER PUBLICATIONS

Afsardoost, Sepideh et al.—"Digital Predistortion Using a Vector-Switched Model" IEEE Transactions on Microwave Theory and Techniques, vol. 60, No. 4, Apr. 2012, pp. 1166-1174 (9 pages).

Hong, Steven et al.—"Applications of Self-Interterence Cancellation in 5G and Beyond"—IEEE Communications Magazine, Feb. 2014, pp. 114-121 (8 pages).

Nezami, Mohamed K.—"Fundamentals of Power Amplifier Linearization Using Digital Pre-Distortion"—High Frequenc Electronics Magazine, Sep. 200 (4 pages).

* cited by examiner

DIGITAL PREDISTORTION FOR FULL-DUPLEX RADIO

This application claims the benefit of U.S. Provisional Application No. 62/198,734, filed on Jul. 30, 2015 which is incorporated by reference herein in its entirety.

TECHNICAL FIELD

This disclosure relates to wireless communication systems and more particularly to full-duplex radio communications.

DESCRIPTION OF THE RELATED ART

Wireless communication systems are rapidly growing in usage. Further, wireless communication technology has evolved from voice-only communications to also include the transmission of data, such as Internet and multimedia content. The proliferation of wireless communications may lead to a scarcity of frequency spectrum. Techniques to improve spectrum utilization may be desired.

Full-duplex (FD) radio is an area of active research at the forefront of developing wireless technology. FD radio involves a device transmitting and receiving radio signal at the same time, using the same frequency resources. This is in contrast to conventional techniques for emulating full-duplex communication, in which transmission and receiving are performed using different time slices (time dimension duplexing) or different frequency resources (frequency dimension duplexing), for example. FD communications may advantageously increase spectrum utilization. During FD communications, however, the transmitted radio signals may interfere with received signals. Therefore, FD radio typically involves interference cancellation to isolate the transmitted signal and accurately detect received signals. Thus commercial implementation of FD radio may be difficult, and improvements in the field may be desired.

SUMMARY

Techniques are disclosed relating to use of digital predistortion in the context of full-duplex radio. In some embodiments, an apparatus includes one or more antennas and is configured to simultaneously transmit and receive wireless signals via at least partially overlapping frequency resources using the one or more antennas. In some embodiments, the apparatus includes receive chain circuitry that is configured to process, during such full-duplex communications, both wireless signals transmitted by the apparatus via the one or more antennas and over-the-air wireless signals from one or more other computing devices. In some embodiments, the apparatus includes one or more processing elements configured to determine one or more digital predistortion parameters based on the wireless signals transmitted by the apparatus via the one or more antennas and processed by the receive chain circuitry. In some embodiments, the one or more processing elements are configured to apply predistortion to transmitted wireless signals based on the one or more digital predistortion parameters.

The disclosed techniques may improve nonlinear interference cancellation of full-duplex radio communications using digital predistortion and may allow re-use of the receive chain circuitry rather than requiring an additional receiver chain for digital predistortion.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Various units, circuits, or other components may be described or claimed as "configured to" perform a task or tasks. In such contexts, "configured to" is used to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. §112(f) for that unit/circuit/component.

DETAILED DESCRIPTION

Figure 1:
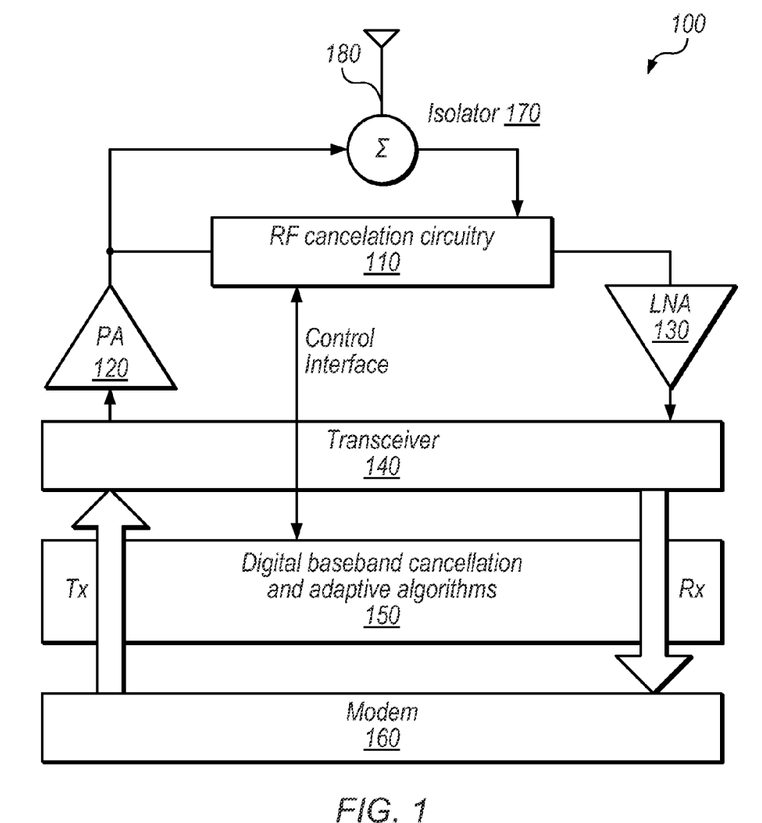
FIG. 1 is a block diagram illustrating exemplary full-duplex radio circuitry, according to some embodiments.
Figure 2:
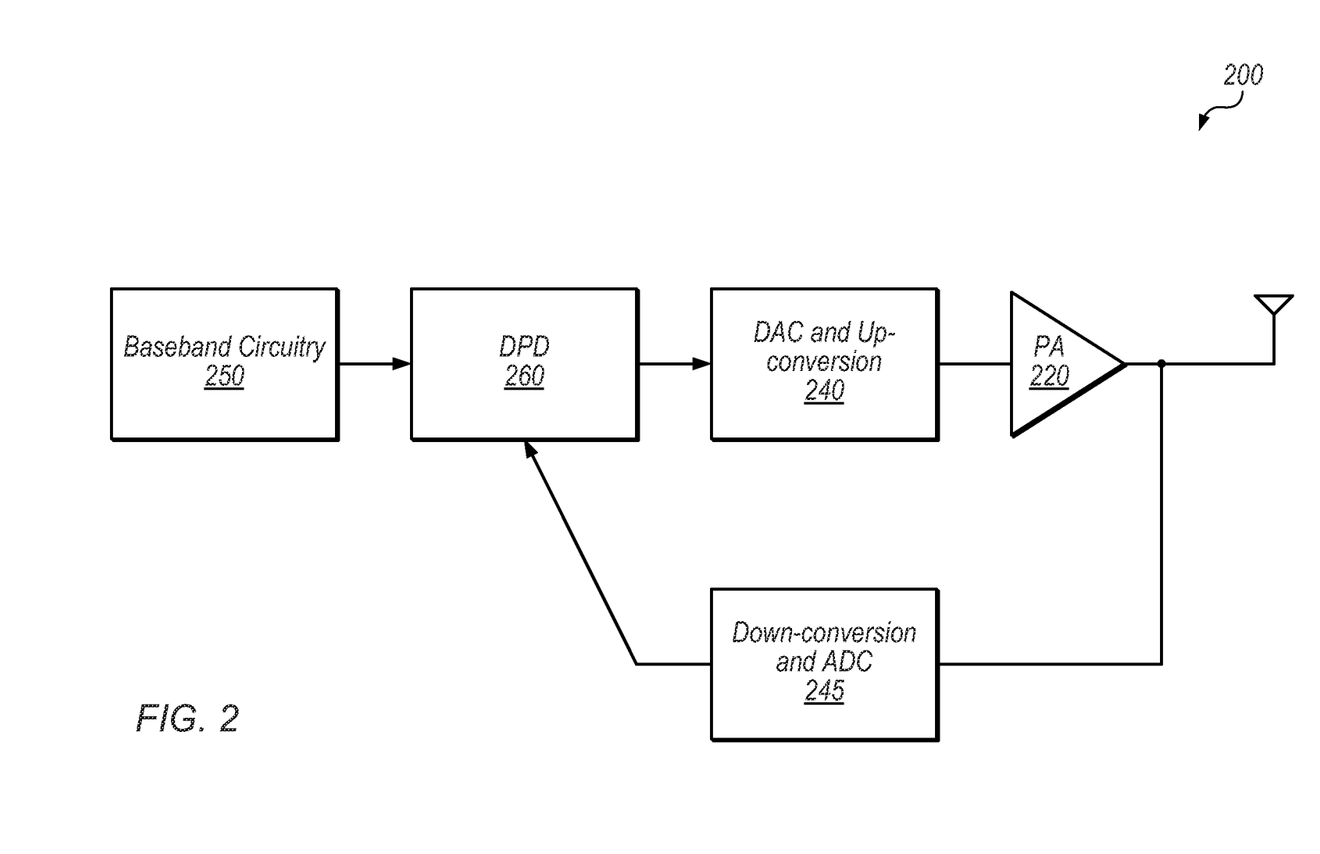
FIG. 2 is a block diagram illustrating exemplary digital predistortion circuitry, according to some embodiments.
Figure 3:
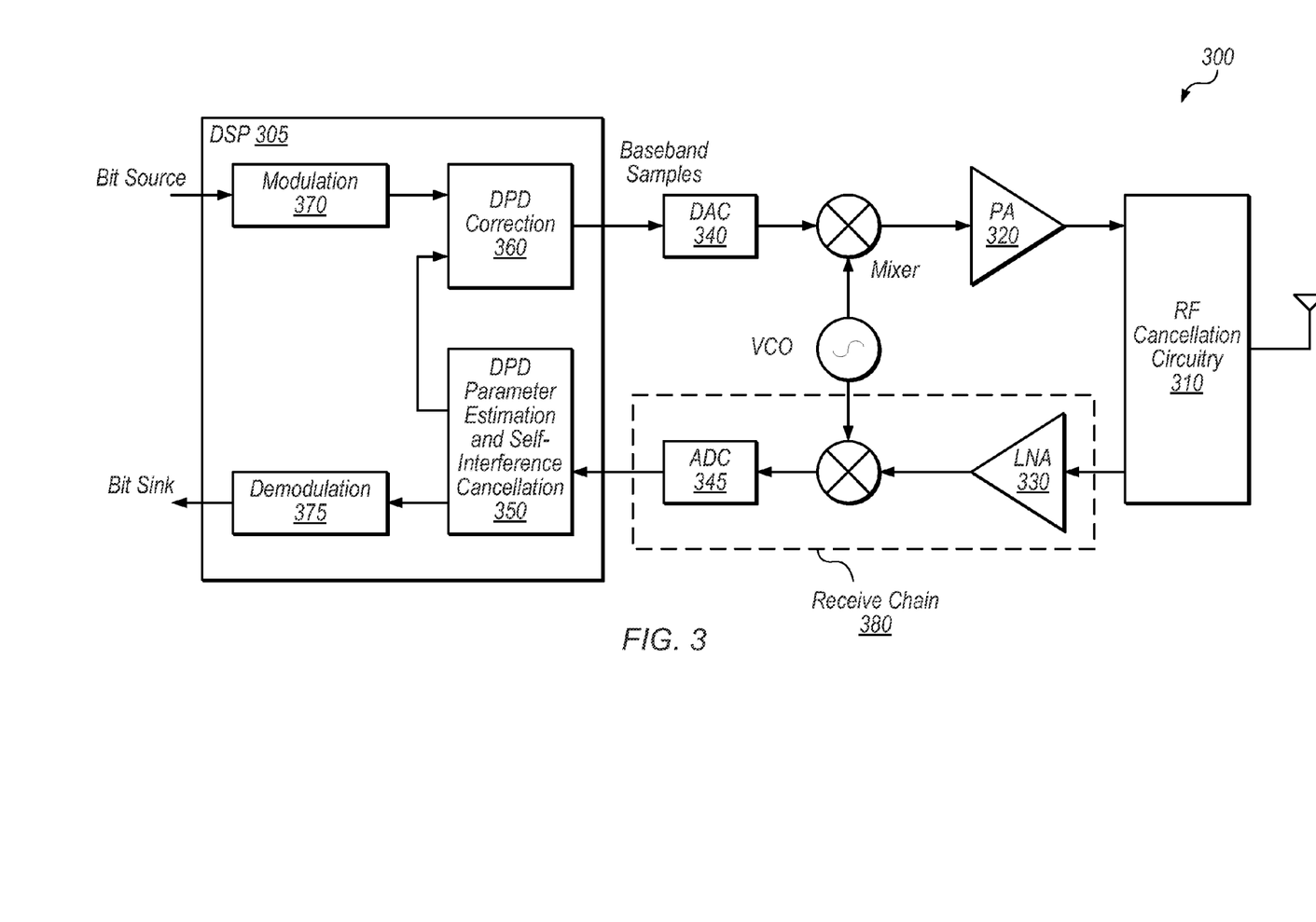
FIG. 3 is a block diagram illustrating a system that uses a receiver chain for both full-duplex radio reception and digital predistortion, according to some embodiments.

This disclosure initially describes, with reference to FIGS. 1-2, an overview of full-duplex (FD) radio and digital predistortion (DPD) respectively. An exemplary system that uses DPD in the context of FD radio is shown in FIG. 3. In some embodiments, the disclosed techniques may improve nonlinear interference cancellation of FD radio with DPD. Further, the disclosed application of DPD in the context of FD radio does not require an extra receiver chain for DPD feedback in some embodiments, as transmitted signals are already present in the normal FD receive chain.

Acronyms

The following acronyms may be used in the present disclosure.
3GPP: Third Generation Partnership Project
CDMA: Code Division Multiple Access
DL: Downlink
FD: Full Duplex
FFT: Fast Fourier Transform
FPGA: Field Programmable Gate Array
GSM: Global System for Mobile Communications
LTE: Long Term Evolution
MIMO: Multiple Input Multiple Output
OFDM: Orthogonal Frequency-Division Multiplexing
RAT: Radio Access Technology
RF: Radio Frequency
RX: Receive
SDR: Software Defined Radio
TX: Transmit
UE: User Equipment
UL: Uplink
UMTS: Universal Mobile Telecommunications System
WCDMA: Wideband Code Division Multiple Access

Terms

The following is a glossary of terms used in the present application:

Memory Medium—Any of various types of memory devices or storage devices. The term "memory medium" is intended to include an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. The memory medium may include other types of memory as well or combinations thereof. In addition, the memory medium may be located in a first computer system in which the programs are executed, or may be located in a second different computer system which connects to the first computer system over a network, such as the Internet. In the latter instance, the second computer system may provide program instructions to the first computer for execution. The term "memory medium" may include two or more memory mediums which may reside in different locations, e.g., in different computer systems that are connected over a network. The memory medium may store program instructions (e.g., embodied as computer programs) that may be executed by one or more processors.

Carrier Medium—a memory medium as described above, as well as a physical transmission medium, such as a bus, network, and/or other physical transmission medium that conveys signals such as electrical, electromagnetic, or digital signals.

Computer System—any of various types of computing or processing systems, including a personal computer system (PC), mainframe computer system, workstation, network appliance, Internet appliance, personal digital assistant (PDA), personal communication device, smart phone, television system, grid computing system, or other device or combinations of devices. In general, the term "computer system" can be broadly defined to encompass any device (or combination of devices) having at least one processor that executes instructions from a memory medium.

User Equipment (UE) (or "UE Device")—any of various types of computer systems devices which are mobile or portable and which performs wireless communications. Examples of UE devices include mobile telephones or smart phones (e.g., iPhone™, Android™-based phones), portable gaming devices (e.g., Nintendo DS™, PlayStation Portable™, Gameboy Advance™, iPhone™), laptops, PDAs, portable Internet devices, music players, data storage devices, other handheld devices, as well as wearable devices such as wrist-watches, headphones, pendants, earpieces, etc. In general, the term "UE" or "UE device" can be broadly defined to encompass any electronic, computing, and/or telecommunications device (or combination of devices) which is easily transported by a user and capable of wireless communication.

Base Station—The term "Base Station" has the full breadth of its ordinary meaning, and at least includes a wireless communication station installed at a fixed location and used to communicate as part of a wireless telephone system or radio system.

Processing Element—refers to various elements or combinations of elements. Processing elements include, for example, circuits such as an ASIC (Application Specific Integrated Circuit), portions or circuits of individual processor cores, entire processor cores, individual processors, programmable hardware devices such as a field programmable gate array (FPGA), and/or larger portions of systems that include multiple processors.

Automatically—refers to an action or operation performed by a computer system (e.g., software executed by the computer system) or device (e.g., circuitry, programmable hardware elements, ASICs, etc.), without user input directly specifying or performing the action or operation. Thus the term "automatically" is in contrast to an operation being manually performed or specified by the user, where the user provides input to directly perform the operation. An automatic procedure may be initiated by input provided by the user, but the subsequent actions that are performed "automatically" are not specified by the user, i.e., are not performed "manually", where the user specifies each action to perform. For example, a user filling out an electronic form by selecting each field and providing input specifying information (e.g., by typing information, selecting check boxes, radio selections, etc.) is filling out the form manually, even though the computer system must update the form in response to the user actions. The form may be automatically filled out by the computer system where the computer system (e.g., software executing on the computer system) analyzes the fields of the form and fills in the form without any user input specifying the answers to the fields. As indicated above, the user may invoke the automatic filling of the form, but is not involved in the actual filling of the form (e.g., the user is not manually specifying answers to fields but rather they are being automatically completed). The present specification provides various examples of operations being automatically performed in response to actions the user has taken.

Full-Duplex Radio Overview

FIG. 1 shows an exemplary full-duplex (FD) radio device 100, according to some embodiments. In the illustrated embodiment, device 100 includes RF cancellation circuitry 110, power amplifier (PA) 120, low-noise amplifier (LNA) 130, transceiver 140, digital baseband cancellation and adaptive algorithms module 150, modem 160, isolator 170, and antenna 180.

In the illustrated embodiment, device is configured to simultaneously transmit and receive wireless radio signals via antenna 180 using at least partially overlapping frequency resources, resulting in FD communications. In some embodiments, device 100 may include multiple antennas, and one antenna may be used for transmission and another for reception. In some embodiments, various analog front-end isolation circuitry (e.g., such as isolator 170 and circuitry 110) may be implemented to reduce interference. Even if using different antennas for transmission and reception, to successfully decode transmissions from other devices, it is typically necessary to further cancel out signals transmitted by device 100 (which may be referred to as self-interfering signals). In the illustrated embodiment, RF cancellation circuitry 110 is configured to perform analog cancellation of self-interfering signals (which may avoid receiver saturation) while module 150 (which may be implemented by a digital signal processor (DSP) for example) is configured to perform digital cancellation, e.g., based on modeling non-linear distortions of self-interfering signals. This may enable decoding of over-the-air wireless signals from other devices.

PA 120, in some embodiments, is configured to amplify a low-power radio-frequency (RF) signal from transceiver 140 in order to drive a signal via antenna 180. LNA 130, in the illustrated embodiment, is configured to amplify weak signals from antenna 180, after cancellation by circuitry 110, for further processing. LNA 130 may be designed to have low-noise characteristics because the gain of LNA 130 may reduce the noise of later stages of the receive chain while noise from LNA 130 may be directly injected into the received signal. Isolator 170, in the illustrated embodiment, may itself reduce self-interference by as much as 20 dB, in some embodiments. Transceiver 140 and modem 160 may be configured according to any of various radio implementations and may be configured to convert between analog and digital data and transmit/receive bit streams.

The illustrated embodiment of FIG. 1 is included for illustrative purposes but is not intended to limit the scope of the present disclosure. In other embodiments, any of various FD radio implementations may be used. In some embodiments, discussed in detail below, the receive chain circuitry of device 100 (e.g., a portion of transceiver 140) is used for both FD radio communications and digital predistortion.

Digital Predistortion Overview

FIG. 2 shows an exemplary radio device 200 configured to perform digital predistortion, according to some embodiments. Digital predistortion (DPD) is also an area of active research in wireless technology. DPD typically involves applying an inverse model of a power amplifier's gain and phase characteristics to a signal, prior to providing the signal to the amplifier. Applying this "inverse distortion" to the amplifier input may improve the linearity of the power amplifier and/or increase its efficiency. DPD typically requires a receive chain to receive the transmitted output signal (in a feedback loop), in order to model the output signal and configure the predistortion. In some embodiments, e.g., as discussed below with reference to FIG. 3, the receive chain of an FD radio device is also used for DPD rather than requiring an additional receive chain.

In the illustrated embodiment, device 200 includes baseband circuitry 250, DPD unit 260, digital-to-analog converter (DAC) and up-conversion circuitry 240, PA 220, and down-conversion and analog-to-digital converter (ADC) circuitry 245 (which may be referred to as receive chain circuitry). In the illustrated embodiment, DPD unit 260 is configured to model distortion in the output signal and apply the inverse of the modeled distortion to data being transmitted. Thus, DPD involves a feedback loop via a receive chain, in various embodiments, which may require an initialization phase in the presence of a downlink signal followed by steady state operations.

Exemplary Application of DPD to FD Radio Using a Single Receive Chain

FIG. 3 shows a device 300 configured to perform FD radio and DPD, according to some embodiments. In the illustrated embodiment, device 300 is configured to use receive chain 380 for both FD radio communications and DPD parameter estimation.

In the illustrated embodiment, device 300 includes digital signal processor (DSP) 305, RF cancellation circuitry 310 (which may be configured similarly to the RF cancellation circuitry 110 of FIG. 1), PA 320, LNA 330, mixer circuitry and a voltage controller oscillator (VCO), DAC 340, and ADC 345. In the illustrated embodiment, DSP 305 is configured to implement modulation 370 and demodulation 375 of the incoming and outgoing digital bit streams, DPD parameter estimation and self-interference cancellation 350, and DPD correction 360.

The VCO and mixer circuitry may be configured to perform up-conversion from a baseband frequency for RF transmissions and down-conversion of received RF signals to the baseband frequency, as is well-understood by those of skill in the art. DAC 340 may be configured to generate analog signals at the baseband frequency while ADC 345 may be configured to generate digital samples based on analog signals at the baseband frequency.

DPD parameter estimation, e.g., as performed by element 350, may use any of various appropriate known or as-yet undiscovered techniques or combinations thereof. These may include, for example, a look-up table approach, the well-known amplitude-to-amplitude modulation (AM/AM) or amplitude-to-phase modulation (AM/PM) approaches, direct or indirect adaptive learning techniques, etc. DPD correction element 360 may apply determined DPD parameters to predistort the signals to be transmitted (e.g., using the inverse of the estimated distortion). This may improve the linearity of PA 320.

Because device 300 is configured to perform FD radio communications and RF cancellation circuitry 310 does not cancel out all self-interfering signals, receive chain 380 is configured to carry both (1) self-interfering wireless signals transmitted by apparatus 300 (which are typically distorted in non-linear fashion) and (2) wireless signals from one or more other computing devices, in the illustrated embodiment. Thus, in the illustrated embodiment, DSP 305 is configured to perform DPD parameter estimation using wireless signals transmitted by apparatus 300 and processed by receive chain 380 as feedback. Further, in the illustrated embodiment, DSP 305 is then configured to perform self-interference cancellation to remove these self-interfering wireless signals to enable decoding of desired signals from other devices. DPD correction element 360 may then apply distortion to outgoing signals based on the determined DPD parameters. In the illustrated embodiment, an extra receive chain is not needed (e.g., because the same receive chain 380 is used for both FD radio reception and DPD), which may reduce the circuit area and/or power consumption of device 300. Said another way, the natural PA feedback coupling is exploited for simultaneous use by the DPD processing element(s). Further, applying DPD to FD radio as shown may improve nonlinear interference cancellation of the FD radio communications. For example, DPD receivers used for monitoring PA output are often simplified (e.g., trading accuracy related to ADC resolution, bandwidth, etc. for a reduction in cost). Therefore, using the FD-radio receiver chain may improve DPD performance relative to using a separate, simplified receiver chain, in some embodiments.

The exemplary circuitry of receive chain 380 is included for purposes of illustration and is not intended to limit the scope of the present disclosure. In some embodiments, the receive chain circuitry may include additional elements and/or omit one or more of the elements shown. In some embodiments, receive chain circuitry includes at least an analog to digital converter and down-conversion circuitry.

Exemplary Method

Figure 4:
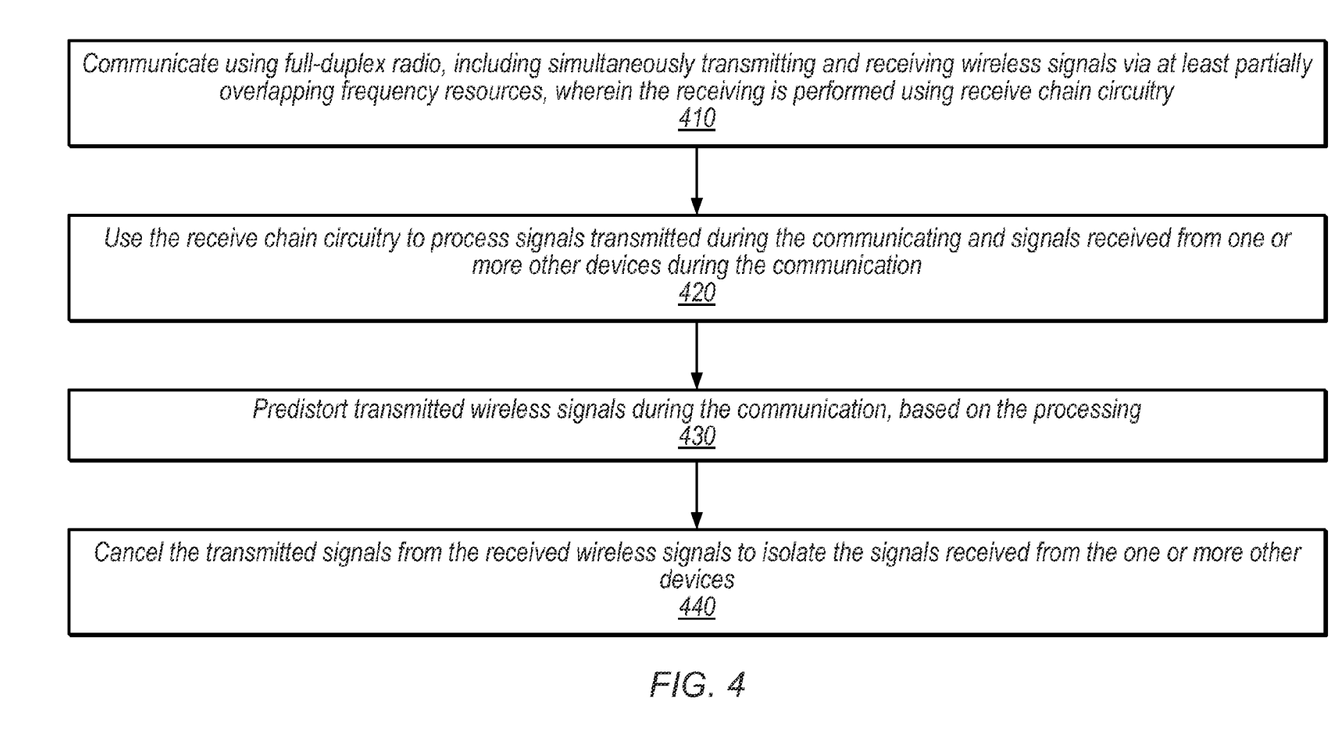
FIG. 4 is a flow diagram illustrating an exemplary method for using digital predistortion for full-duplex radio, according to some embodiments.

FIG. 4 is a flow diagram illustrating an exemplary method for using an FD radio receive chain for DPD, according to some embodiments. The method shown in FIG. 4 may be used in conjunction with any of the computer circuitry, systems, devices, elements, or components disclosed herein, among other devices. In various embodiments, some of the method elements shown may be performed concurrently, in a different order than shown, or may be omitted. Additional method elements may also be performed as desired.

In some embodiments, the method may be performed by a cellular user equipment (UE) device. In some embodiments, the method may be performed by a cellular base station. In still other embodiments, the method may be performed by a computing device configured for non-cellular wireless communications such as WIFI, Bluetooth satellite navigation, satellite television, marine VHF radio, etc. Flow begins at block 410.

At 410, a computing device communicates using full-duplex radio, which includes simultaneously transmitting and receiving wireless signals via at least partially overlapping frequency resources. In the illustrated embodiment, the receiving is performed using receive chain circuitry.

At 420, the computing device uses the receive chain circuitry to process signals transmitted during the communicating (e.g., self-interfering signals) and signals received from one or more other devices during the communication (e.g., desired incoming communication signals). This may include amplifying received signals, down-converting received signals, and/or converting received signals to digital data, in some embodiments.

At 430, the computing device predistorts transmitted wireless signals during the communication, based on the processing. For example, DSP 305 may use processed signals from the receive chain circuitry to estimate distortion and apply an inverse of the distortion to transmitted signals.

At 440, the computing device cancels the transmitted signals from the received wireless signals to isolate the signals received from the one or more other devices. For example, DSP 305 use various self-interference techniques to cancel out at least a portion of transmitted signals such that received messages from other devices may be decoded. Using the same receive chain circuitry for canceling self-interfering signals and for digital predistortion may reduce power consumption and/or chip area, in some embodiments. Flow ends at 440.

The disclosed techniques may be used for any of various types of FD wireless communications, including but not limited to cellular communications. Thus, the disclosed techniques may be used for wireless communications between a UE and a base station, between mobile devices, between non-mobile computing devices, between an access point and a base station, between an access point and a mobile device, etc., without limitation.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
   one or more antennas, wherein the apparatus is configured to simultaneously transmit and receive wireless signals via at least partially overlapping frequency resources using the one or more antennas;
   receive chain circuitry configured to process, during the simultaneous transmission and reception:
      wireless signals transmitted by the apparatus via the one or more antennas; and
      wireless signals from one or more other computing devices;
   one or more processing elements configured to, during the simultaneous transmission and reception:
      perform digital self-interference cancelation to cancel at least a portion of signals wirelessly transmitted by the apparatus via the one or more antennas and processed by the receive chain circuitry;
      determine one or more digital predistortion parameters based on the wireless signals transmitted by the apparatus via the one or more antennas and processed by the receive chain circuitry; and
      apply predistortion to transmitted wireless signals based on the one or more digital predistortion parameters.

2. The apparatus of claim 1, wherein the apparatus is further configured to:
   cancel a portion of the wireless signals transmitted by the apparatus via the one or more antennas and received by the receive chain circuitry, using analog front-end self-interference cancellation circuitry.

3. The apparatus of claim 1, wherein the one or more processing elements include a digital signal processor configured to determine the one or more digital predistortion parameters.

4. The apparatus of claim 1,
   wherein the apparatus includes transmit chain circuitry that includes a digital to analog converter, up-conversion circuitry, and a power amplifier; and
   wherein the receive chain circuitry includes a low-noise amplifier, down-conversion circuitry, and an analog to digital converter.

5. The apparatus of claim 1, wherein the one or more antennas include a first antenna configured to transmit wireless signals and a second antenna configured to receive wireless signals.

6. The apparatus of claim 1, wherein the apparatus is a user equipment device (UE).

7. The apparatus of claim 1, wherein the apparatus is a base station.

8. A method, comprising:
   communicating using full-duplex radio, including simultaneously transmitting and receiving wireless signals via at least partially overlapping frequency resources, wherein the receiving is performed using receive chain circuitry;
   processing, by the receive chain circuitry, signals transmitted during the communicating and signals received from one or more other devices during the communicating;
   predistorting transmitted wireless signals during the communicating, based on the processing by the receive chain circuitry; and performing digital self-interference cancellation to cancel at least a portion of the transmitted signals from the received wireless signals to isolate the signals received from the one or more other devices.

9. The method of claim 8, further comprising:
cancelling a first portion of the transmitted signals using analog front-end circuitry.

10. The method of claim 8, wherein the predistorting is performed by a digital signal processor configured to determine one or more digital predistortion parameters based on signals processed by the receive chain circuitry.

11. The method of claim 8, wherein the processing includes amplifying received wireless signals, down-converting the amplified signals to a baseband frequency, and converting the down-converted signals to digital information.

12. The method of claim 8, wherein the transmitting and receiving are performed using separate antennas coupled to the same device.

13. The method of claim 8, wherein the communicating, predistorting, processing, and canceling are performed by at least one of a mobile cellular device or a cellular base station.

14. A non-transitory computer-readable medium having instructions stored thereon that are executable by a computing device to perform operations comprising:
communicating using full-duplex radio, including simultaneously transmitting and receiving wireless signals via at least partially overlapping frequency resources, wherein the receiving uses receive chain circuitry;
processing, using the receive chain circuitry, signals transmitted during the communicating and signals received from one or more other devices during the communicating;
predistorting transmitted wireless signals during the communicating, based on the processing by the receive chain circuitry; and
performing digital self-interference cancellation to cancel at least a portion of the transmitted signals from the received wireless signals to isolate the signals received from the one or more other devices.

15. The non-transitory computer-readable medium of claim 14, wherein a portion of the transmitted signals in the received wireless signals are canceled using analog front-end circuitry.

16. The non-transitory computer-readable medium of claim 14, wherein the predistortion and the digital self-interference cancellation are performed using the same signals from the receive chain circuitry.

17. The non-transitory computer-readable medium of claim 14, wherein the receive chain circuitry includes at least one of: a low-noise amplifier, down-conversion circuitry, or an analog to digital converter.

18. The non-transitory computer-readable medium of claim 14, wherein the communicating is performed using separate antennas for transmitting and receiving.

19. The non-transitory computer-readable medium of claim 14, wherein the predistorting is performed using at least one of a look-up table technique, an inverse amplitude-to-amplitude modulation technique, an inverse amplitude-to-phase modulation technique, or an adaptive learning technique.

20. The non-transitory computer-readable medium of claim 14, wherein the computing device is a cellular base station.

* * * * *